(12) United States Patent
McReynolds et al.

(10) Patent No.: US 7,588,693 B2
(45) Date of Patent: *Sep. 15, 2009

(54) METHOD OF MODIFYING AN ETCHED TRENCH

(75) Inventors: Darrell LaRue McReynolds, Balmain (AU); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 173 days.

This patent is subject to a terminal disclaimer.

(21) Appl. No.: 11/242,916

(22) Filed: Oct. 5, 2005

(65) Prior Publication Data

US 2006/0076312 A1     Apr. 13, 2006

(30) Foreign Application Priority Data

Oct. 8, 2004     (AU) ............................. 2004905800

(51) Int. Cl.
  *C23F 1/00*    (2006.01)
  *G01D 15/00*   (2006.01)
(52) U.S. Cl. ........................................ 216/27; 216/67
(58) Field of Classification Search ................ 216/17, 216/27, 39, 46, 63, 66, 71
See application file for complete search history.

(56) References Cited

U.S. PATENT DOCUMENTS

| | | | |
|---|---|---|---|
| 6,277,756 B1 | 8/2001 | Ohara et al. | |
| 6,569,777 B1 | 5/2003 | Hsu et al. | |
| 6,583,065 B1 | 6/2003 | Williams et al. | |
| 6,764,810 B2* | 7/2004 | Ma et al. | 430/313 |
| 2005/0280674 A1* | 12/2005 | McReynolds | 347/65 |

FOREIGN PATENT DOCUMENTS

| | | |
|---|---|---|
| JP | 2001-212965 | 8/2001 |
| WO | WO 01/22481 A1 | 3/2001 |
| WO | WO 02/15249 A2 | 2/2002 |

* cited by examiner

*Primary Examiner*—Allan Olsen

(57) ABSTRACT

A process for facilitating modification of an etched trench is provided. The process comprises: (a) providing a wafer comprising an etched trench, the trench having a photoresist plug at its base; and (b) removing a portion of the photoresist by subjecting the wafer to a biased oxygen plasma etch. The process is particularly suitable for preparing a trench for subsequent argon ion milling. Printhead integrated circuits fabricated by a process according to the invention have improved ink channel surface profiles and/or surface properties.

17 Claims, 11 Drawing Sheets

METHOD OF MODIFYING AN ETCHED TRENCH

FIELD OF THE INVENTION

This invention relates to a process for modifying sidewalls of a trench etched into a semiconductor wafer. It has been developed primarily for incorporation into a printhead integrated circuit manufacturing process in order to provide an ink channel having improved surface properties and/or improved surface profile. However, it may equally be incorporated into any etching process.

COPENDING APPLICATIONS

The following application has been filed by the applicant simultaneously with the present application:

Ser. No. 11/242917

The disclosure of this copending application is incorporated herein by reference. The above application has been identified by its filing docket number, which will be substituted with the corresponding application number once assigned.

Cross References to Related Applications

Various methods, systems and apparatus relating to the present invention are disclosed in the following U.S. Patents/patent applications filed by the applicant or assignee of the present invention:

| | | | | | |
|---|---|---|---|---|---|
| 6750901 | 6476863 | 6788336 | 09/517539 | 6566858 | 6331946 |
| 6246970 | 6442525 | 09/517384 | 09/505951 | 6374354 | 09/517608 |
| 6816968 | 6757832 | 6334190 | 6745331 | 09/517541 | 10/203559 |
| 10/203560 | 7093139 | 10/636263 | 10/636283 | 10/866608 | 10/902889 |
| 10/902833 | 10/940653 | 10/942858 | 11/003786 | 11/003616 | 11/003418 |
| 11/003334 | 11/003600 | 11/003404 | 11/003419 | 11/003700 | 11/003601 |
| 11/003618 | 11/003615 | 11/003337 | 11/003698 | 11/003420 | 6984017 |
| 11/003699 | 11/071473 | 11/003463 | 11/003710 | 11/003683 | 11/003614 |
| 11/003702 | 11/003684 | 11/003619 | 11/003617 | 6623101 | 6406129 |
| 6505916 | 6457809 | 6550895 | 6457812 | 10/296434 | 6428133 |
| 10/815625 | 10/815624 | 10/815628 | 10/913375 | 10/913373 | 10/913374 |
| 10/913372 | 10/913377 | 10/913378 | 10/913380 | 10/913379 | 10/913376 |
| 7122076 | 10/986402 | 11/172816 | 11/172815 | 11/172814 | 10/407212 |
| 10/407207 | 10/683064 | 10/683041 | 6746105 | 10/760272 | 10/760273 |
| 7083271 | 10/760182 | 7080894 | 10/760218 | 7090336 | 10/760216 |
| 10/760233 | 10/760246 | 7083257 | 10/760243 | 10/760201 | 10/760185 |
| 10/760253 | 10/760255 | 10/760209 | 7118192 | 10/760194 | 10/760238 |
| 7077505 | 10/760235 | 7077504 | 10/760189 | 10/760262 | 10/760232 |
| 10/760231 | 10/760200 | 10/760190 | 10/760191 | 10/760227 | 7108353 |
| 7104629 | 10/728804 | 7128400 | 7108355 | 6991322 | 10/728790 |
| 7118197 | 10/728970 | 10/728784 | 10/728783 | 7077493 | 6962402 |
| 10/728803 | 10/728780 | 10/728779 | 7118198 | 10/773204 | 10/773198 |
| 10/773199 | 6830318 | 10/773201 | 10/773191 | 10/773183 | 7108356 |
| 7118202 | 10/773186 | 10/773200 | 10/773185 | 10/773192 | 10/773197 |
| 10/773203 | 10/773187 | 10/773202 | 10/773188 | 7118201 | 7111926 |
| 10/773184 | 7018021 | 11/060751 | 11/060805 | 11/188017 | 11/097308 |
| 11/097309 | 11/097335 | 11/097299 | 11/097310 | 11/097213 | 11/210687 |
| 11/097212 | 11/212637 | 09/575197 | 7079712 | 09/575123 | 6825945 |
| 09/575165 | 6813039 | 6987506 | 7038797 | 6980318 | 6816274 |
| 7102772 | 09/575186 | 6681045 | 6728000 | 09/575145 | 7088459 |
| 09/575181 | 7068382 | 7062651 | 6789194 | 6789191 | 6644642 |
| 6502614 | 6622999 | 6669385 | 6549935 | 6987573 | 6727996 |
| 6591884 | 6439706 | 6760119 | 09/575198 | 6290349 | 6428155 |
| 6785016 | 6870966 | 6822639 | 6737591 | 7055739 | 09/575129 |
| 6830196 | 6832717 | 6957768 | 09/575162 | 09575172 | 09/575170 |
| 7106888 | 7123239 | 10/727181 | 10/727162 | 10/727163 | 10/727245 |
| 7121639 | 10/727233 | 10/727280 | 10/727157 | 10/727178 | 7096137 |
| 10/727257 | 10/727238 | 10/727251 | 10/727159 | 10/727180 | 10/727179 |
| 10/727192 | 10/727274 | 10/727164 | 10/727161 | 10/727198 | 10/727158 |
| 10/754536 | 10/754938 | 10/727227 | 10/727160 | 10/934720 | 11/212702 |
| 10/296522 | 6795215 | 7070098 | 09/575109 | 6805419 | 6859289 |
| 6977751 | 6398332 | 6394573 | 6622923 | 6747760 | 6921144 |
| 10/884881 | 7092112 | 10/949294 | 11/039866 | 11/123011 | 6986560 |
| 7008033 | 11/148237 | 10/922846 | 10/922845 | 10/854521 | 10/854522 |
| 10/854488 | 10/854487 | 10/854503 | 10/854504 | 10/854509 | 10/854510 |
| 7093989 | 10/854497 | 10/854495 | 10/854498 | 10/854511 | 10/854512 |
| 10/854525 | 10/854526 | 10/854516 | 10/854508 | 10/854507 | 10/854515 |
| 10/854506 | 10/854505 | 10/854493 | 10/854494 | 10/854489 | 10/854490 |
| 10/854492 | 10/854491 | 10/854528 | 10/854523 | 10/854527 | 10/854524 |
| 10/854520 | 10/854514 | 10/854519 | 10/854513 | 10/854499 | 10/854501 |
| 10/854500 | 10/854502 | 10/854518 | 10/854517 | 10/934628 | 11/212823 |
| 10/760254 | 10/760210 | 10/760202 | 10/760197 | 10/760198 | 10/760249 |
| 10/760263 | 10/760196 | 10/760247 | 10/760223 | 10/760264 | 10/760244 |
| 7097291 | 10/760222 | 10/760248 | 7083273 | 10/760192 | 10/760203 |
| 10/760204 | 10/760205 | 10/760206 | 10/760267 | 10/760270 | 10/760259 |
| 10/760271 | 10/760275 | 10/760274 | 7121655 | 10/760184 | 10/760915 |
| 10/760186 | 10/760261 | 7083272 | 11/014764 | 11/014763 | 11/014748 |
| 11/014747 | 11/014761 | 11/014760 | 11/014757 | 11/014714 | 11/014713 |
| 11/014762 | 11/014724 | 11/014723 | 11/014756 | 11/014736 | 11/014759 |
| 11/014758 | 11/014725 | 11/014739 | 11/014738 | 11/014737 | 11/014726 |
| 11/014745 | 11/014712 | 11/014715 | 11/014751 | 11/014735 | 11/014734 |
| 11/014719 | 11/014750 | 11/014749 | 11/014746 | 11/014769 | 11/014729 |
| 11/014743 | 11/014733 | 11/014754 | 11/014755 | 11/014765 | 11/014766 |
| 11/014740 | 11/014720 | 11/014753 | 11/014752 | 11/014744 | 11/014741 |
| 11/014768 | 11/014767 | 11/014718 | 11/014717 | 11/014716 | 11/014732 |
| 11/014742 | 11/097268 | 11/097185 | 11/097184 | | |

The disclosures of those applications and patents are incorporated herein by reference.

BACKGROUND OF THE INVENTION

The impact of MEMS (Microelectromechanical Systems) devices on the microelectronics industry has been extremely significant in recent years. Indeed, MEMS is one of the fastest growing areas of microelectronics. The growth of MEMS has been enabled, to a large extent, by the extension of silicon-based photolithography to the manufacture of micro-scale mechanical devices and structures. Photolithographic techniques, of course, rely on reliable etching techniques, which allow accurate etching of a silicon substrate revealed beneath a mask.

MEMS devices have found applications in a wide variety of fields, such as in physical, chemical and biological sensing devices. One important application of MEMS devices is in inkjet printheads, where micro-scale actuators for inkjet nozzles may be manufactured using MEMS techniques. The present Applicant has developed printheads incorporating MEMS ink ejection devices and these are the subject of a number of patents and patent applications listed in the Cross References section above and all of which are incorporated herein by reference.

Typically a MEMS inkjet printhead ("MEMJET printhead") is comprised of a plurality of integrated circuits, with each integrated circuit having several thousand nozzles. Each nozzle comprises an actuator for ejecting ink, which may be, for example, a thermal bend actuator (e.g. U.S. Pat. No. 6,322,195) or a bubble-forming heater element actuator (e.g. U.S. Pat. No. 6,672,709). The integrated circuits are manufactured using MEMS techniques, meaning that a high nozzle density and, hence, high resolution printheads can be mass-produced at relatively low cost.

In the manufacture of MEMS printhead integrated circuits, it is often required to perform deep or ultradeep etches. Etch depths of about 3 □m to 10 □m may be termed "deep etches", whereas etch depths of more than about 10 □m may be termed "ultradeep etches.

MEMS printhead integrated circuits typically require delivery of ink to each nozzle through individual ink supply channels having a diameter of about 20 µm. These ink channels are typically etched through wafers having a thickness of about 200 µm, and therefore place considerable demands on the etching method employed. It is especially important that each ink channel is perpendicular to the wafer surface and does not contain kinks, sidewall projections (e.g. grassing) or angular junctions, which can interfere with the flow of ink.

In the Applicant's U.S. patent application Ser. No. 10/728,784 (Applicant Ref: MTB08) and Ser. No. 10/728,970 (Applicant Ref: MTB07), both of which are incorporated herein by reference, there is described a method of fabricating inkjet printheads from a wafer 5 having a drop ejection side and an ink supply side. Referring to FIG. 1, there is shown a typical MEMS nozzle arrangement 1 comprising a bubble-forming heater element actuator assembly 2. The actuator assembly 2 is formed in a nozzle chamber 3 on the passivation layer 4 of a silicon wafer 5. The wafer typically has a thickness "B" of about 200 µm, whilst the nozzle chamber typically occupies a thickness "A" of about 20 µm. The nozzle chamber 3 has an inlet 8, which joins an ink supply channel (not shown in FIG. 1) in the silicon wafer 5.

Referring to FIG. 2, an ink supply channel 6 is formed in the wafer 5 by first etching a trench through the CMOS metallization layer of a TEOS interconnect 7 and partially through the wafer 5 from the ink ejection side 20 of the wafer. Once formed, the trench is plugged with photoresist 10 whilst nozzle structures are formed on the ink ejection side 20 of the wafer. After formation of the nozzle arrangement 1, the ink supply channel 6 is formed by ultradeep etching from the ink supply side 30 of the wafer to and past the photresist plug 10.

Referring to FIG. 3, the photoresist plug 10 is finally stripped away to form the inlet 8. The inlet 8 provides fluid connection between the ink supply channel 6 and the nozzle chamber 3. FIGS. 2 and 3 also shows the CMOS drive circuitry 9, which is provided between the wafer 5 and the interconnect 7.

The "back-etching" of the ink supply channel avoids filling and removing an entire 200 µm long ink supply channel with resist whilst nozzle structures in the wafer are being lithographically formed. However, there are a number of problems associated with back-etching the ink supply channels in this way. Firstly, the mask on the ink supply side needs to be carefully aligned so that the etched channels meet the trenches plugged with photoresist, and do not damage the drive circuitry 9. Secondly, the etching needs to be perpendicular and anisotropic to a depth of about 200 µm.

Several methods for etching ultradeep trenches into silicon are known in the art. All these methods involve deep reactive ion etching (DRIE) using a gas plasma. The semiconductor substrate, with a suitable mask disposed thereon, is placed on a lower electrode in a plasma reactor, and exposed to an ionized gas plasma formed from a mixture of gases. The ionized plasma gases (usually positively charged) are accelerated towards the substrate by a biasing voltage applied to the electrode. The plasma gases etch the substrate either by physical bombardment, chemical reaction or a combination of both. Etching of silicon is usually ultimately achieved by formation of volatile silicon halides, such as $SiF_4$, which are carried away from the etch front by a light inert carrier gas, such as helium.

Anisotropic etching is usually achieved by depositing a passivation layer onto the base and sidewalls of the trench as it is being formed, and selectively etching the base of the trench using the gas plasma.

The most widely used method for achieving ultradeep anisotropic etching is the "Bosch process", described in U.S. Pat. Nos. 5,501,893 and 6,284,148. This method involves alternating polymer deposition and etching steps. After formation of a shallow trench, a first polymer deposition step deposits a polymer onto the base and sidewalls of the trench. The polymer is deposited by a gas plasma formed from a fluorocarbon gas (e.g $CHF_3$, $C_4F_8$ or $C_2F_4$) in the presence or in the absence of an inert gas. In the subsequent etching step, the plasma gas mix is changed to $SF_6$/Ar. The polymer deposited on the base of the trench is quickly broken up by ion assistance in the etching step, while the sidewalls remain protected. Hence, anisotropic etching may be achieved.

However, a major disadvantage of the Bosch process is that polymer deposition and etching steps need to be alternated, which means continuously alternating the gas composition of the plasma, thereby slowing etch rates. This alternation, in turn, leads to uneven trench sidewalls, characterized by scalloped surface formations.

A further disadvantage of the Bosch process is that it leaves a hydrophobic fluorocarbon polymer coating ('Bosch polymer') on the trench sidewalls. In ink channels for inkjet printheads, it is desirable to provide hydrophilic sidewalls so that ink is drawn into ink supply channels by a capillary action.

Hitherto, such polymeric coatings were removed by either $O_2$ ashing or a 'wet' clean. The standard industry method for removing 'Bosch polymer' residues is to use an EKC™ wet clean, followed by DI rinse(s) and spin drying. However, both $O_2$ ashing and EKC™ cleans suffer from serious problems during MEMS processing of a silicon wafer. Usually, a silicon wafer being processed in a MEMS foundry is attached to a handle wafer, such as a glass handle wafer, using a release tape such as Revalpha™ thermal release tape. The handle wafer is necessary so that the silicon wafer can be handled during backside processing steps, without damaging any sensitive structures (e.g. inkjet nozzles) already fabricated the frontside of the wafer. As described above, typically, during MEMS manufacture of an inkjet printhead, nozzles are first formed on a frontside of wafer and then ink supply channels are etched from a backside of the wafer. Before performing backside processing steps (e.g. wafer grinding, etching), the frontside of the wafer, having a protective photoresist coating, is usually attached to a handle wafer using a thermal release tape. The thermal release tape comprises a film having a thermal release adhesive on one side. The thermal release adhesive conveniently allows the silicon wafer to be detached from the handle wafer by controlled heating after the completion of backside processing steps.

However, standard $O_2$ ashing ovens are run out about 220-240° C., which is well above the release temperature of standard thermal release tape (about 160-180° C.). Consequently, the silicon wafer delaminates from the handle wafer during $O_2$ ashing in a standard ashing oven. Lowering the temperature of ashing oven produces unacceptably low ashing rates and does not ensure complete removal of any polymeric residues coated on sidewalls of etched features.

Moreover, standard EKC™ cleans tend to attack thermal release tape chemically, also causing highly undesirable delamination.

An additional problem with ultradeep anisotropic etching is that anisotropy tends to be lost when the etch front meets the photoresist plug 10. FIGS. 2 and 3 show an idealized fabrication process in which the etch front continues to etch anistropically and flush against the photoresist plug 10 when the etch front meets the photoresist. In practice however, and referring to FIG. 4, when the etch front meets the photoresist plug 10, the etch flares radially outwards, leaving a spiked circumferential rim 13 around the photoresist plug. Radial flaring where the etch front meets the photoresist plug is believed to be due to mutual charge repulsion between a charge built up on the photoresist and the charged ions in the plasma. The radially flared etch terminus 12 and the corresponding spiked circumferential rim 13 are shown in FIG. 4.

The radially flared etch terminus 12 is undesirable in the final printhead integrated circuit when the photoresist is removed (FIG. 5). The flared etch terminus 12 acts as a pocket, which can trap slow-moving ink or gas bubbles. This can lead to disruption of the flow of ink from the ink channel 6 to the inlet 8 and the nozzle downstream.

Moreover, the spiked rim 13, which faces the flow of oncoming ink, is relatively weakly supported by the bulk wafer 5 and can easily break off into one or more slivers. The creation of slivers in the ink flow is highly undesirable and will typically result in failure of the nozzle downstream.

It would be desirable to provide a process, which exposes angular or spiked surface features in an etched trench, thereby facilitating modification of such features. It would further be desirable to provide a process for manufacturing a printhead integrated circuit, whereby ink channels formed in the process have improved surface profiles.

It would be also be desirable to provide an alternative process for removing a hydrophobic polymeric layer deposited on the sidewalls of a trench during etching. It would further be desirable to provide a process for removing such polymers, which is compatible with industry standard thermal release tape, and does not cause delamination. It would further be desirable to provide a process for manufacturing a printhead integrated circuit, whereby ink channels formed in the process have improved surface properties.

SUMMARY OF THE INVENTION

In a first aspect, there is provided a method of removing a polymeric coating from sidewalls of an etched trench defined in a silicon wafer, said method comprising etching said wafer in a biased plasma etching chamber using an $O_2$ plasma, wherein said chamber temperature is in the range of 90 to 180° C.

In a second aspect, there is provided a method of etching a trench in a silicon wafer, said method comprising the steps of:
  (a) attaching a frontside of said silicon wafer to a handle wafer;
  (b) etching a backside of wafer using an anisotropic DRIE process to form a trench, said DRIE process including alternating etching and passivation steps, said passivation steps depositing a polymeric coating on sidewalls of said trench;
  (c) removing said polymeric coating by etching said wafer in a biased plasma etching chamber using an $O_2$ plasma, wherein said chamber temperature is in the range of 100 to 180° C.

In a third aspect, the present invention provides a process for facilitating modification of an etched trench, the process comprising:
  (a) providing a wafer comprising at least one etched trench, the at least one trench having a photoresist plug at its base; and
  (b) removing a portion of the photoresist by subjecting the wafer to a biased oxygen plasma etch.

In a fourth aspect, the present invention provides a method of fabricating an inkjet printhead integrated circuit comprising a plurality of nozzles, ejection actuators, associated drive circuitry and ink supply channels, the method comprising the steps of:
  (i) providing a wafer having a front drop ejection side and a back ink supply side;
  (ii) etching a plurality of trenches partially into the drop ejection side of the wafer;
  (iii) filling each of the trenches with a photoresist plug;
  (iv) forming a plurality of corresponding nozzles, ejection actuators and associated drive circuitry on the drop ejection side of the wafer using lithographically masked etching techniques;
  (v) back-etching a plurality of corresponding ink supply channels from the ink supply side of the wafer to and past the photoresist plugs;
  (vi) removing a portion of each photoresist plug by subjecting the wafer to a biased oxygen plasma etch, thereby exposing angular sidewall features in the ink supply channels;
  (vii) modifying the exposed angular sidewall features; and
  (viii) stripping the photoresist plugs from the trenches to form nozzle inlets, thereby providing fluid connection between the ink supply side and the nozzles.

In a fifth aspect, the present invention provides an inkjet printhead integrated circuit fabricated by the method described above.

The method according to the first and second aspects of the present application advantageously allow a hydrophobic polymeric sidewall residue (e.g. 'Bosch polymer') to be removed from a trench, without overheating the silicon wafer. Overheating of the silicon wafer may cause damage of sensitive MEMS structures already formed on the wafer by stresses exerted, for example, by photoresist expansion. Moreover, overheating typically causes delimination of the wafer from a handle wafer to which the silicon wafer is usually attached. Accordingly, it is as advantage of the present invention that polymeric residues can be removed without using potentially damaging EKC™ cleaning or $O_2$ plasma ashing. The polymeric coating is generally replaced by more hydrophilic silicon oxide layer.

By using a source of $O_2$ plasma, which is biased in a plasma etching chamber, the $O_2$ plasma has sufficient energy to remove polymeric residues in deep (e.g. over 100 micron deep) trenches at a temperature lower than the release temperature of standard thermal release tape.

With reference to the third, fourth and fifth aspects of the present application, hitherto, the importance of the surface profile of ink supply channels in printheads fabricated by MEMS techniques had not been fully appreciated. Whilst several ultradeep etching techniques have become available in recent years, none of these addresses the problems described above when back-etching towards (and beyond) a photoresist plug. In particular, the problem of a sharp, potentially frangible, circumferential rim being formed in the sidewalls had not been addressed. As discussed above, this rim is formed during back-etching as the etch front radially flares around the photoresist plug (see FIGS. 4 and 5).

The problem of an etch front radially flaring around a photoresist plug can be addressed, to some extent, by special etching techniques. An example of one such special etching technique is described in U.S. Pat. No. 6,187,685 (assigned to Surface Technology Systems). However, whilst the technique described in U.S. Pat. No. 6,187,685 can reduce the angle of flaring relative to the perpendicular, it still does not completely eliminate the formation of a circumferential rim around the photoresist plug. Indeed, since the resultant rim is made thinner by reducing the degree of flaring, the frangibility of the rim may actually be increased, thereby increasing the likelihood of slivers breaking off from the sidewalls and blocking the nozzle.

Rather than attempting to eliminate formation of this circumferential rim, the present invention provides a method for facilitating its removal in a post-etching step. In the method of the present invention, a portion of the photoresist plug is removed so as to expose the circumferential rim formed around the plug during deep or ultradeep etching. Once exposed, the circumferential rim may be smoothed or rounded by ion milling. Hence, printheads made by the process of the present invention generally exhibit improved ink flow through their ink supply channels and minimize the risk of nozzle failure caused by slivers of wafer blocking or damaging the nozzles.

Optional Features of the Invention

The oxygen plasma etch is typically performed in a plasma etching reactor, such as an inductively coupled plasma (ICP) etching reactor. The terms "plasma etching reactor" and "plasma etching chamber" are entirely equivalent terms of art.

Plasma etching reactors are well known in the art and are commercially available from various sources (e.g. Surface Technology Systems, PLC). Typically, the etching reactor comprises a chamber formed from aluminium, glass or quartz, which contains a pair of parallel electrode plates. However, other designs of reactor are available and the present invention is suitable for use with any type of plasma etching reactor.

A radiofrequency (RF) energy source is used to ionize a gas mixture introduced into the chamber. The resultant ionized gas plasma is accelerated towards a substrate disposed on a lower electrode (also referred to as an electrostatic chuck or a platen) by a biasing voltage. According, the plasma etching chamber can be used for biased etches in which a gas plasma is directed towards a substrate. Various control means are provided for controlling the ICP power, bias power, RF ionizing energy, substrate temperature, chamber pressure, chamber temperature etc.

In the present invention, the plasma etching chamber parameters may be optimized in order to achieve complete removal of polymer coatings from trench sidewalls. Optionally, the bias power is in the range of 10 to 100 W (preferably 30 to 70 W), the ICP power is optionally in the range of 1000 to 3000 W (or 2000 to 3000 W), the chamber temperature is optionally in the range of 90 to 180° C. (or 90 to 150° C., or 120 to 150° C.), the $O_2$ flow rate is optionally in the range of 20 to 200 sccm (preferably 60 to 100 sccm), and the chamber pressure is optionally in the range of 5 to 200 mTorr (optionally 20 to 140 mTorr, or optionally 60 to 100 mTorr). Etching times are typically in the range of 20 to 200 minutes, 30 to 200 minutes or 40 to 80 minutes.

Optionally, the process removes a depth of about 1 to 15 $\Box$m, or optionally a depth of about 2 to 7 $\Box$m, from an exposed back surface of the photoresist plug. The removed portion may be up to 10%, up to 20%, or up to 50% of the total plug volume. Typically, the amount of photoresist removed by the process of the present invention will be sufficient to expose an inner surface of a circumferential rim formed around at least part of the original intact plug by a prior etching process.

Optionally, the process of the invention includes the further step of ion milling exposed angular features, such as the circumferential rim described above. Typically, angular surface features are tapered, smoothed and/or rounded by the ion milling. Hence, ink flowing past these features approaches a curved surface rather than an angular surface, meaning that the ink can flow smoothly past, without generating excessive turbulence and/or air bubbles. Furthermore, the resultant rounded, smoothed and/or tapered features are less frangible and are therefore less likely to cause nozzle failure by slivers breaking off and entering the nozzle chamber.

The ion milling is usually performed in a plasma etching reactor, such as the inductively coupled plasma etching reactor described above.

Optionally, the ion milling is performed using a heavy inert gas selected from argon, krypton or xenon. Preferably, the inert gas is argon since this is widely available at relatively low cost, and, because of its relatively high mass, has excellent sputtering properties. Typically, an argon ion plasma is generated in a plasma etching reactor, and the argon ions accelerated perpendicularly towards a silicon wafer having ink supply channels etched therein.

Plasma reactor parameters may be varied in order to achieve optimal ion milling of the wafer. Optionally, the bias power is in the range of 100 to 500 W (preferably 200 to 400 W), the ICP power is in the range of 1000 to 3000 W (preferably about 2500 W), the chamber temperature is in the range of 90 to 150° C. (preferably about 120° C.), and the Ar flow rate is in the range of 20 to 200 sccm (preferably 80 to 120 sccm). Milling times are typically in the range of 5 to 100 minutes, 10 to 60 minutes or 10 to 30 minutes.

The ion milling may be performed at any suitable pressure. Typically, the pressure will be in the range of 2 to 2000 mTorr. In other words, ion milling may be performed at low pressure (about 2 to 250 mTorr) or high pressure (about 250 to 2000 mTorr).

Low pressure ion milling has the advantage that most commercially available plasma etching reactors are configured for low pressure etching. Hence, low pressure ion milling does not require any special apparatus.

However, ion milling may also be performed at high pressure. High pressure ion milling has the advantage that steeper tapering is usually obtainable. The principle of using high pressure ion milling to produce steep taper angles may be understood as follows. Normally, sputter etching is performed at relatively low pressures (e.g. about 5 to 250 mTorr) to achieve high sputter etching efficiency. Such a low pressure produces a nearly collision-free path for silicon atoms sputtered from the surface, thereby optimizing etching efficiency.

By sputter etching at high pressure rather than low pressure, the mean free path of sputtered silicon atoms is reduced, because sputtered (reflected) silicon atoms have a greater chance of colliding with incoming argon ions in the plasma gas. The result is that a gaseous cloud is formed above the substrate surface, which redeposits reflected silicon atoms back onto the silicon surface. There is an increasing net deposition of reflected silicon atoms at greater depths, which results in angular surface features in the sidewalls becoming more tapered.

U.S. Pat. No. 5,888,901, which is incorporated herein by reference, describes high pressure ion milling of a $SiO_2$ dielectric surface using argon as the sputtering gas. Whilst the method described in U.S. Pat. No. 5,888,901 is used for tapering a $SiO_2$ dielectric surface layer, rather than tapering angular surface features on the sidewalls of ultradeep channels etched into silicon, this method may be readily modified and applied to the process of the present invention.

Low pressure ion milling (e.g. 5 to 50 mTorr) is generally preferred in the present invention, because it is usually only necessary to round off angular sidewall features in order to achieve improved ink flow, rather than taper the whole sidewall feature. Moreover, low pressure ion milling does not require any special apparatus and can therefore be easily incorporated into a typical printhead fabrication process.

Optionally, each ink supply channel has a depth in the range of 100 to 300 $\Box$m, optionally 150 to 250 $\Box$m, or optionally about 200 µm. The width/length dimensions of the ink supply channel may vary considerably. Optionally, each ink supply is substantially cylindrical having a diameter in the range of 5 to 30 µm, optionally 14 to 28 µm, or optionally 17 to 25 µm. With such designs, etch flaring is usually significant as the etch front meets the frontside photoresist plug. Alternatively, each ink supply channel has a width of 40 to 120 µm (or 60 to 100 µm), and a length of over 200 µm or over 500 µm. With these wider channel designs, etch flaring is usually insignificant due to dispersion of charge away from the etch front. Notwithstanding this avoidance of etch flaring, the present invention is still used to remove polymeric coatings from trench sidewalls by biased oxygen plasma etching.

Optionally, each nozzle inlet has a depth in the range of 5 to 40 µm, optionally 10 to 30 µm, or optionally 15 to 25 µm. Optionally, each nozzle inlet is substantially cylindrical having a diameter in the range of 3 to 28 µm, optionally 8 to 24 µm, or optionally 12 to 20 µm. Alternatively, each nozzle inlet is substantially cuboid having width/length dimensions in the range of 5 to 40 µm.

Usually, each ink supply channel has a larger diameter than its corresponding nozzle inlet, and the process of the present invention may be used to taper, smooth and/or round off shoulders defined by the junction of the inlet and the ink supply channel.

In a further aspect the present invention provides a process for facilitating modification of an etched trench, the process comprising:
(a) providing a wafer comprising at least one etched trench, the at least one trench having a photoresist plug at its base; and
(b) removing a portion of the photoresist by subjecting the wafer to a biased oxygen plasma etch.

Optionally the wafer comprises a plurality of etched trenches.

Optionally the biased oxygen plasma etch removes a depth of 1 to 15 µm from an exposed surface of the photoresist plug.

Optionally removal of a portion of the photoresist exposes angular features in sidewalls of the trench.

Optionally the process further comprising the step of:
(c) ion milling the exposed angular features.

Optionally trench sidewalls are concomitantly hydrophilized by the biased oxygen plasma etch.

Optionally concomitant hydrophilization includes removal of a polymeric layer from the trench sidewalls.

Optionally the biased oxygen plasma etch is performed in a plasma etching reactor Optionally the plasma etching reactor has a bias power in the range of 10 to 100 W.

Optionally the plasma etching reactor has a chamber pressure in the range of 20 to 140 mTorr.

Optionally forms part of a printhead fabrication process.

Optionally the etched trench is an ink supply channel for a printhead.

Optionally the ink supply channel has a depth in the range of 100 to 300 µm.

In a further aspect the present invention provides a method of fabricating an inkjet printhead integrated circuit comprising a plurality of nozzles, ejection actuators, associated drive circuitry and ink supply channels, the method comprising the steps of:
(i) providing a wafer having a front drop ejection side and a back ink supply side;
(ii) etching a plurality of trenches partially into the drop ejection side of the wafer;
(iii) filling each of the trenches with a photoresist plug;
(iv) forming a plurality of corresponding nozzles, ejection actuators and associated drive circuitry on the drop ejection side of the wafer using lithographically masked etching techniques;
(v) back-etching a plurality of corresponding ink supply channels from the ink supply side of the wafer to and past the photoresist plugs;
(vi) removing a portion of each photoresist plug by subjecting the wafer to a biased oxygen plasma etch, thereby exposing angular sidewall features in the ink supply channels;
(vii) modifying the exposed angular sidewall features; and
(viii) stripping the photoresist plugs from the trenches to form nozzle inlets, thereby providing fluid connection between the ink supply side and the nozzles.

Optionally the angular sidewall features include a circumferential rim around at least a part of the photoresist plug, the circumferential rim being exposed by removing a portion of each plug.

Optionally the exposed angular sidewall features are modified by argon ion milling.

Optionally the argon ion milling smoothes and/or rounds the exposed angular sidewall features.

Optionally the argon ion milling is performed in a plasma etching reactor.

Optionally ink supply channel sidewalls are concomitantly hydrophilized by the biased oxygen plasma etch.

In a further aspect there is provided an inkjet printhead integrated circuit fabricated by the above-mentioned method.

In a further aspect there is provided a method of removing a polymeric coating from sidewalls of an etched trench defined in a silicon wafer, said method comprising etching said wafer in a biased plasma etching chamber using an $O_2$ plasma, wherein a chamber temperature is in the range of 90 to 180° C.

Optionally said etching chamber is an inductively coupled plasma (ICP) etching chamber.

Optionally an ICP power is in the range of 2000 to 3000 W.

Optionally said wafer is attached to a platen, and a biasing platen power is in the range of 10 to 100 W.

Optionally said chamber temperature is in the range of 120 to 150° C.

Optionally a chamber pressure is in the range of 30 to 120 mTorr.

Optionally a chamber pressure is in the range of 60 to 100 mTorr.

Optionally said platen has a temperature in the range of 5 to 20° C.

Optionally said platen is cooled using backside helium cooling.

Optionally an oxygen flow rate to said chamber is in the range of 20 to 200 sccm.

Optionally an etching time is in the range of 40 to 80 minutes.

Optionally said polymeric coating is a hydrophobic fluoropolymer.

Optionally said trench is an ink supply channel for an inkjet printhead.

Optionally said ink supply channel has a width in the range of 20 to 120 microns Optionally said ink supply channel has a depth of at least 100 microns.

Optionally a frontside of said silicon wafer is attached to a handle wafer using adhesive tape, said etched trench being defined in a backside of said wafer.

Optionally said adhesive tape is thermal release tape.

Optionally said adhesive tape is unaffected by said oxygen plasma etching.

Optionally said oxygen plasma etching does not cause delamination of said handle wafer from said silicon wafer.

In a further aspect there is provided a method of etching a trench in a silicon wafer, said method comprising the steps of:
（a) attaching a frontside of said silicon wafer to a handle wafer;
(b) etching a backside of said wafer using an anisotropic DRIE process to form a trench, said DRIE process including alternating etching and passivation steps, said passivation steps depositing a polymeric coating on sidewalls of said trench;
(c) removing said polymeric coating by etching said wafer in a biased plasma etching chamber using an $O_2$ plasma, wherein said chamber temperature is in the range of 90 to 180° C.

DETAILED DESCRIPTION OF A PREFERRED EMBODIMENT

Figure 14:
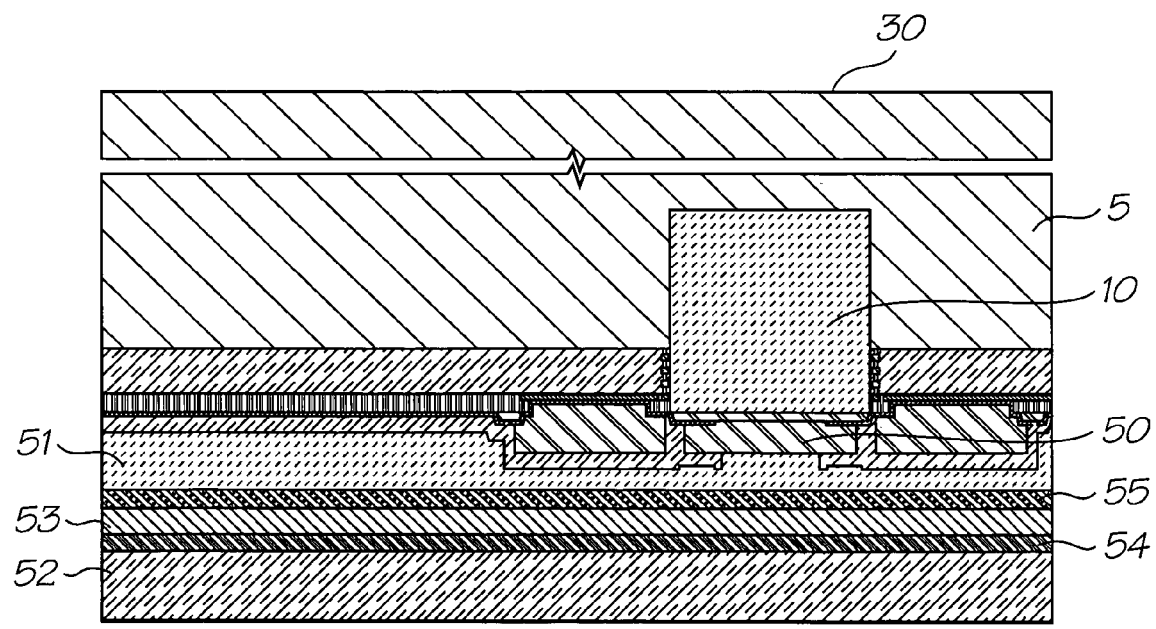
FIG. 14 is a side view of a silicon wafer attached to glass handle wafer.

Referring to FIG. 14, after fabricating MEMS nozzle structures 50 on a frontside of wafer 5, the frontside is coated with a protective layer of photoresist 51 and attached to a glass handle wafer 52. The glass handle wafer 52 is attached using a thermal release tape 53 having a permanent adhesive layer 54 bonded to the glass handle wafer 52, and a thermal release adhesive layer 55 bonded to the protective photoresist 50. An outermost surface of the glass handle wafer 52 is metallized for attachment to an electrotstatic platen in a plasma etching chamber.

With the glass handle wafer 52 is secured thereto, the wafer 5 is back-etched in a plasma etching chamber to define backside ink supply channels. Any standard anisotropic DIRE process (e.g. Bosch etch) may be used for backside etching.

Figure 1:
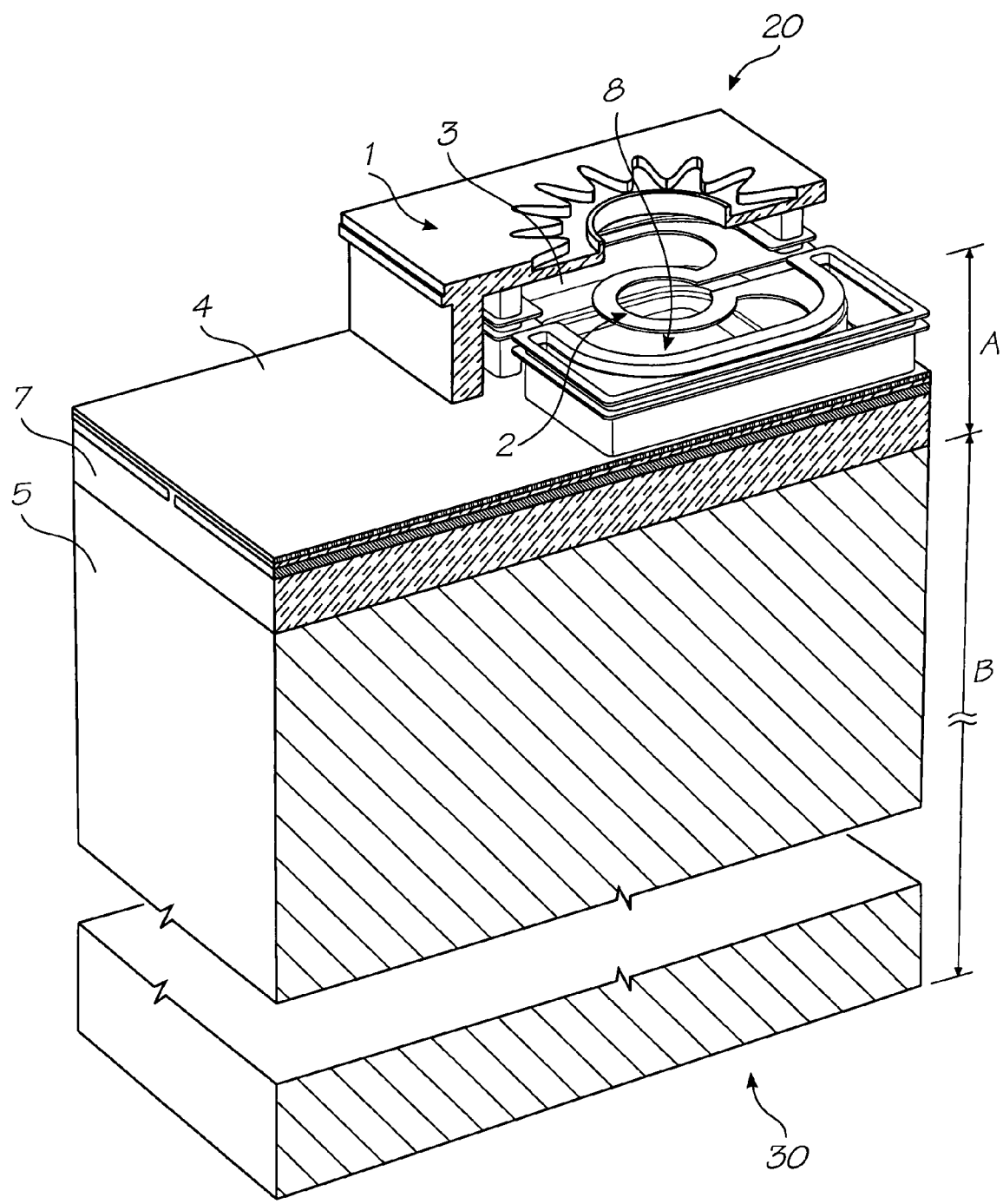
FIG. 1 is a perspective view of a printhead nozzle arrangement for a printhead.
Figure 2:
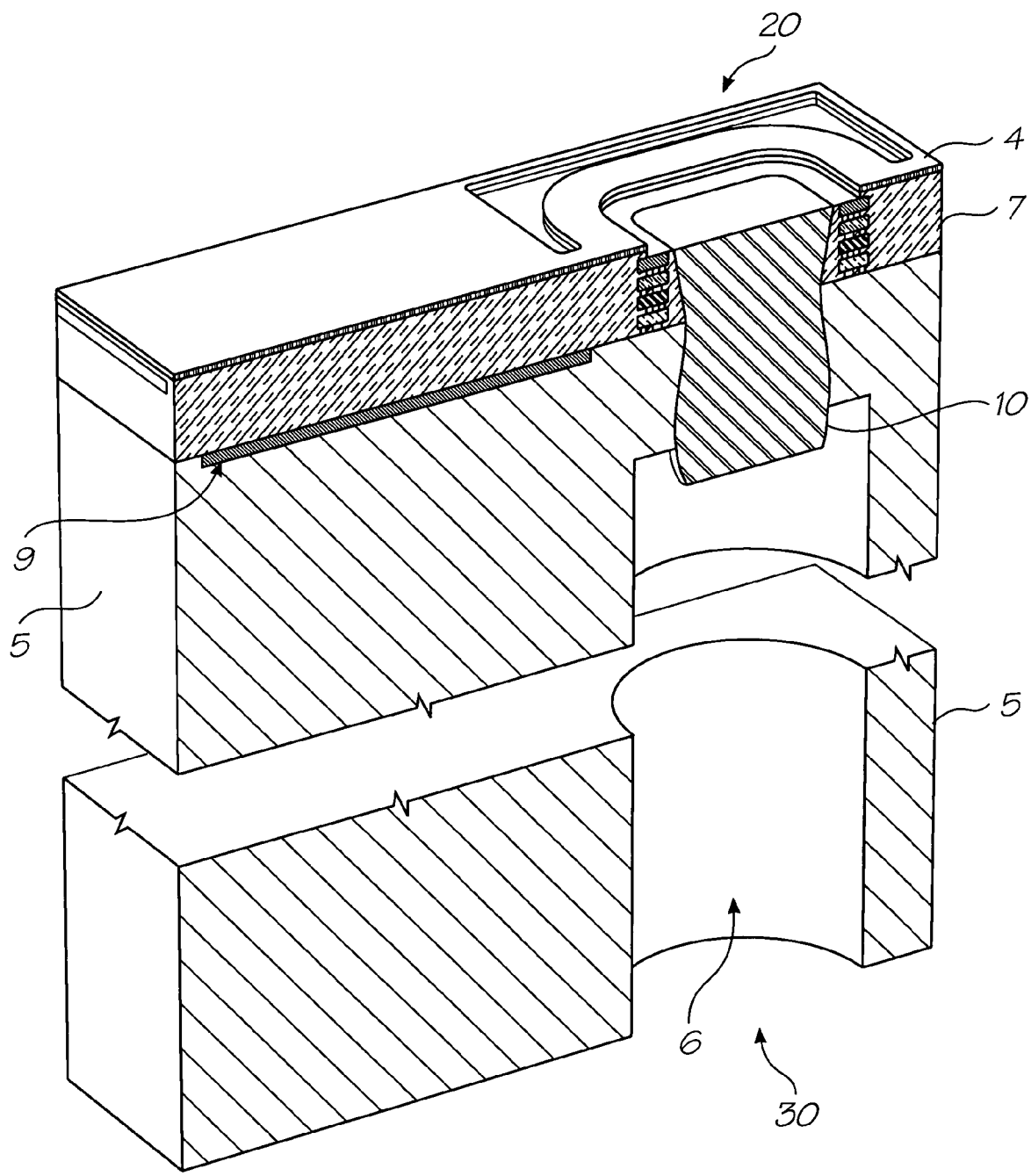
FIG. 2 is cutaway perspective view of an idealized, partially fabricated printhead nozzle arrangement, with the actuator assembly removed and the ink supply channel exposed.
Figure 3:
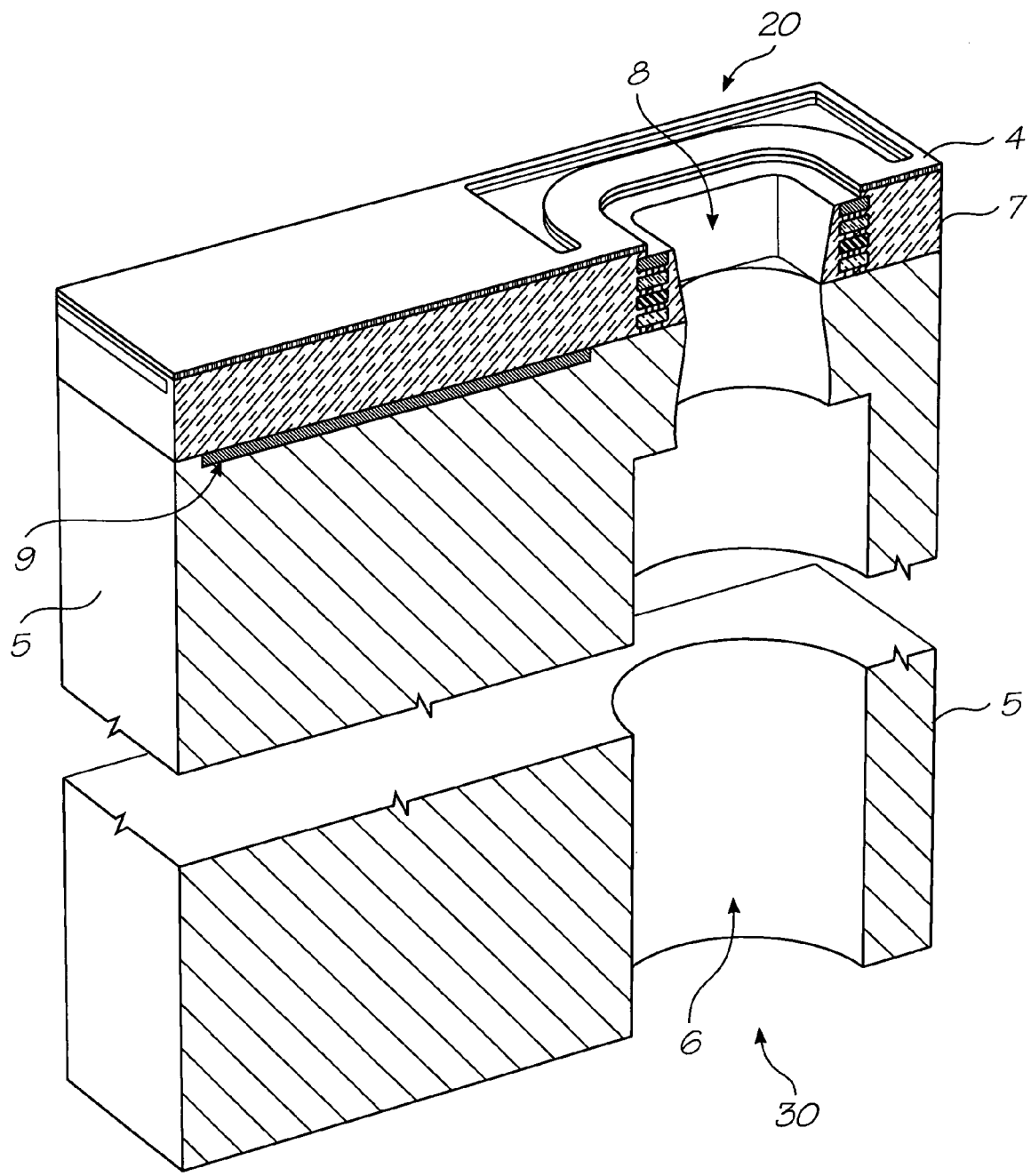
FIG. 3 is a cutaway perspective view of the printhead nozzle arrangement shown in FIG. 2 after stripping away the photoresist plug.
Figure 4:
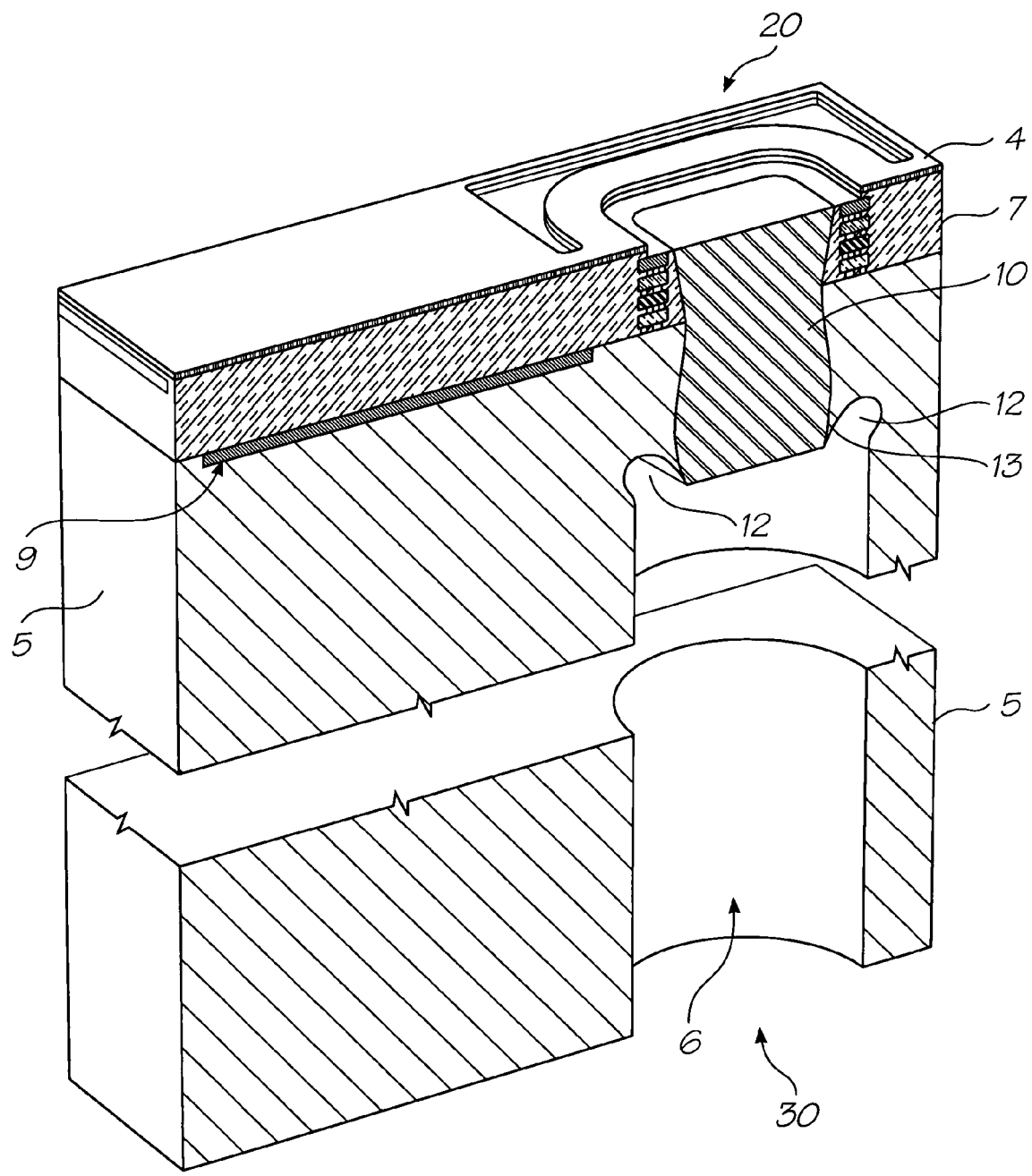
FIG. 4 is a cutaway perspective view of a partially fabricated prior art printhead nozzle arrangement, with the actuator assembly removed and the ink supply channel exposed.
Figure 5:
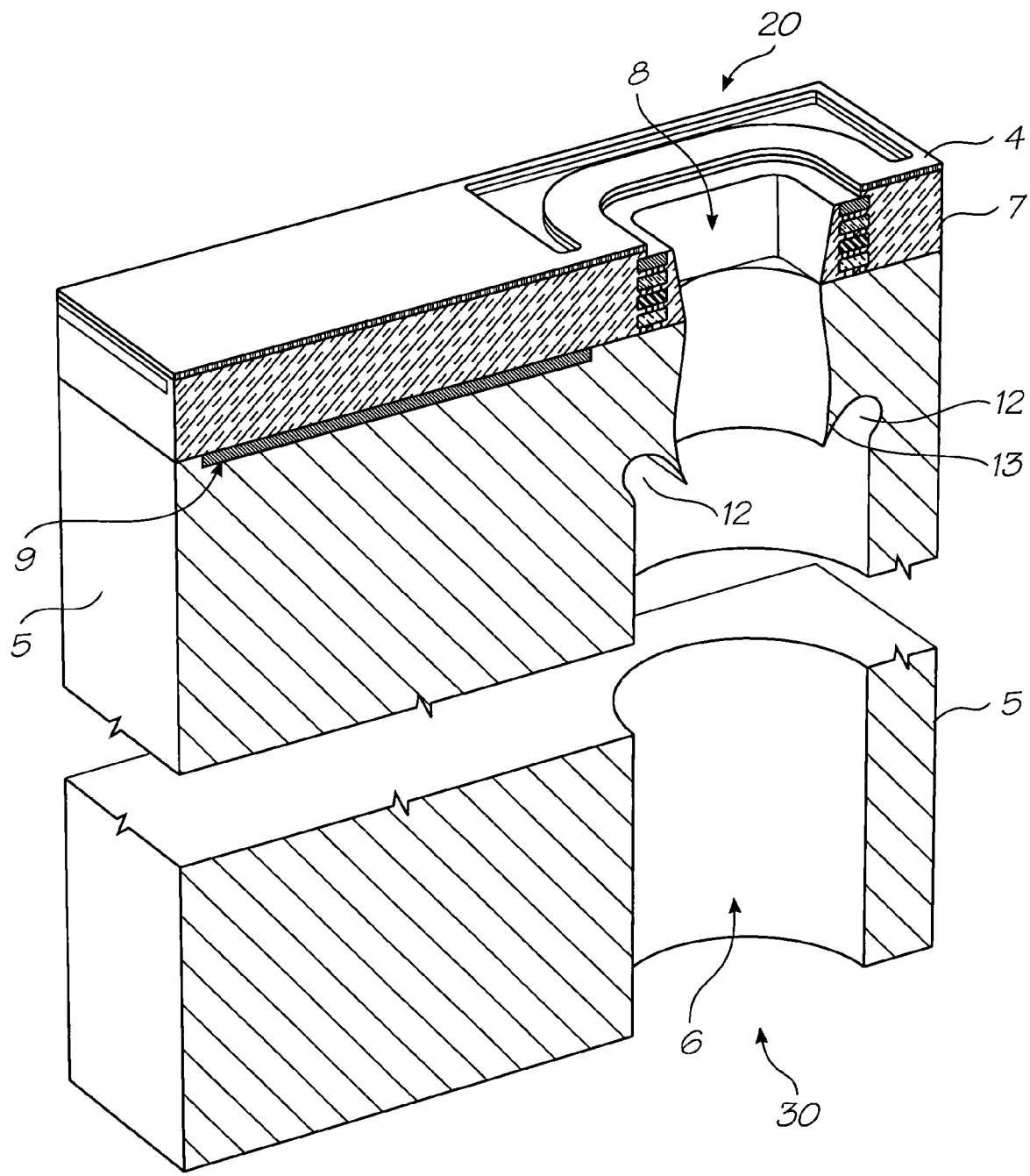
FIG. 5 is a cutaway perspective view of the prior art printhead nozzle arrangement shown in FIG. 4 after stripping away the photoresist plug.

Referring to FIG. 4, there is shown a partially fabricated printhead integrated circuit after back-etching from the ink supply side 30 (backside) of the wafer 5 to and past the photoresist plug 10. As the etch front meets the plug 10 during backside etching, the etch flares radially outwards to give a radially flared etch terminus 12 and a corresponding circumferential rim 13 around part of the plug.

Figure 6:
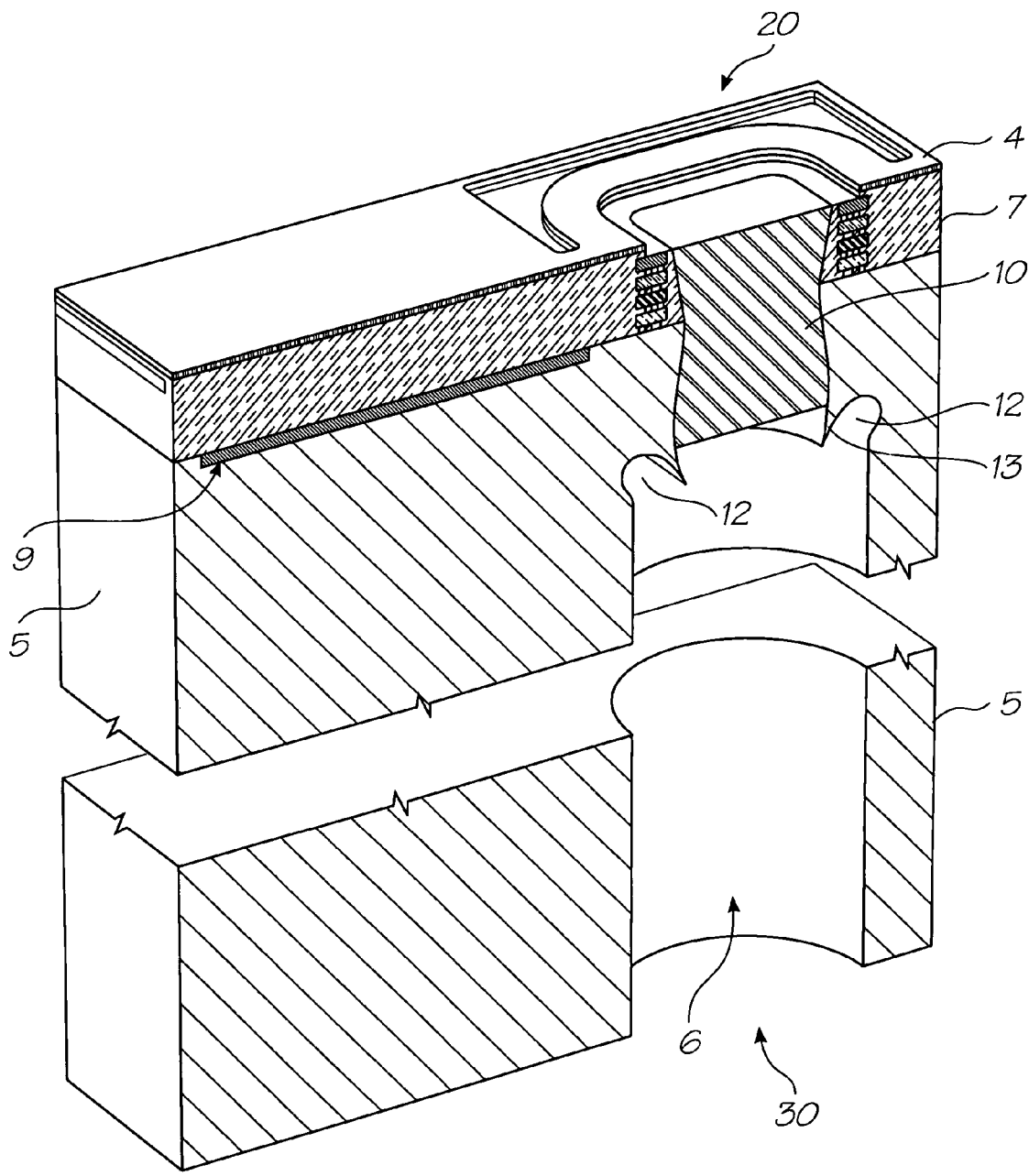
FIG. 6 is a cutaway perspective view of a partially fabricated printhead nozzle arrangement according to the present invention, with the actuator assembly removed and the ink supply channel exposed.

Referring to FIG. 6, the back-etched wafer shown in FIG. 4 is subjected to a biased oxygen plasma etch. The biased oxygen plasma etch is performed in a plasma etching chamber using suitably controlled gas flow, biasing power, ICP power, chamber pressure and etching time. The biased oxygen plasma etch removes a portion of the photoresist plug 10. The portion removed is sufficient to expose the spiked circumferential rim 13.

Additionally, the biased oxygen plasma etch removes any hydrophobic fluorocarbon polymer from the sidewalls of the ink supply channel 6, replacing it with a hydrophilic layer of $SiO_2$. The fluorocarbon polymer coating on the sidewalls of the ink supply channel 6 is typically formed during the anisotropic DIRE process. By replacing the fluorocarbon layer with a hydrophilic $SiO_2$ layer, the surface properties of the ink supply channel 6 are generally improved, without affecting the thermal release tape which secures the wafer 5 to the handle wafer 52. In particular, by avoiding conventional chemical wet cleaning processes and/or high-temperature ashing, delamination is avoided.

Figure 7:
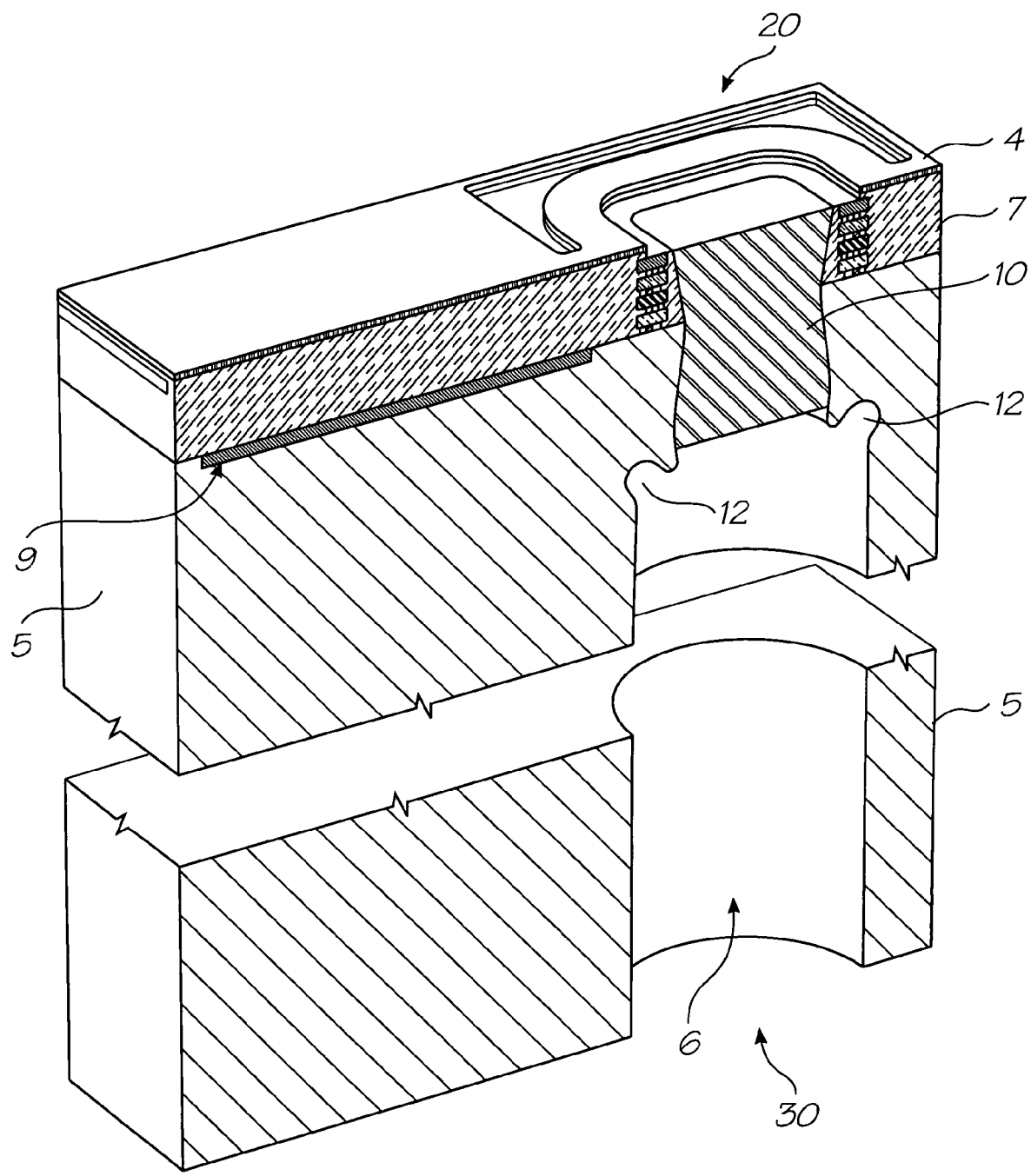
FIG. 7 is a cutaway perspective view of the partially fabricated printhead nozzle arrangement shown in FIG. 6, after ion milling the circumferential rim.

Referring to FIG. 7, the wafer 5 shown in FIG. 6 is subjected to argon ion milling in a plasma etching reactor. Optimal operating parameters of the plasma etching reactor may be readily determined by the person skilled in the art. During argon ion milling, the exposed circumferential rim 13 is smoothed down, which improves the robustness and surface profile of the ink supply channel 6.

The extent to which the circumferential rim 13 is smoothed, rounded and/or tapered will depend on the pressure, bias power and/or the milling time in the plasma etching reactor. The rim 13 may be either rounded down (as shown in FIG. 7) or fully tapered by argon ion milling. In either case, the removal of this spiked projection generally improves ink flow through the channel 6 and minimizes the likelihood of slivers breaking off and blocking the nozzle downstream.

Figure 8:
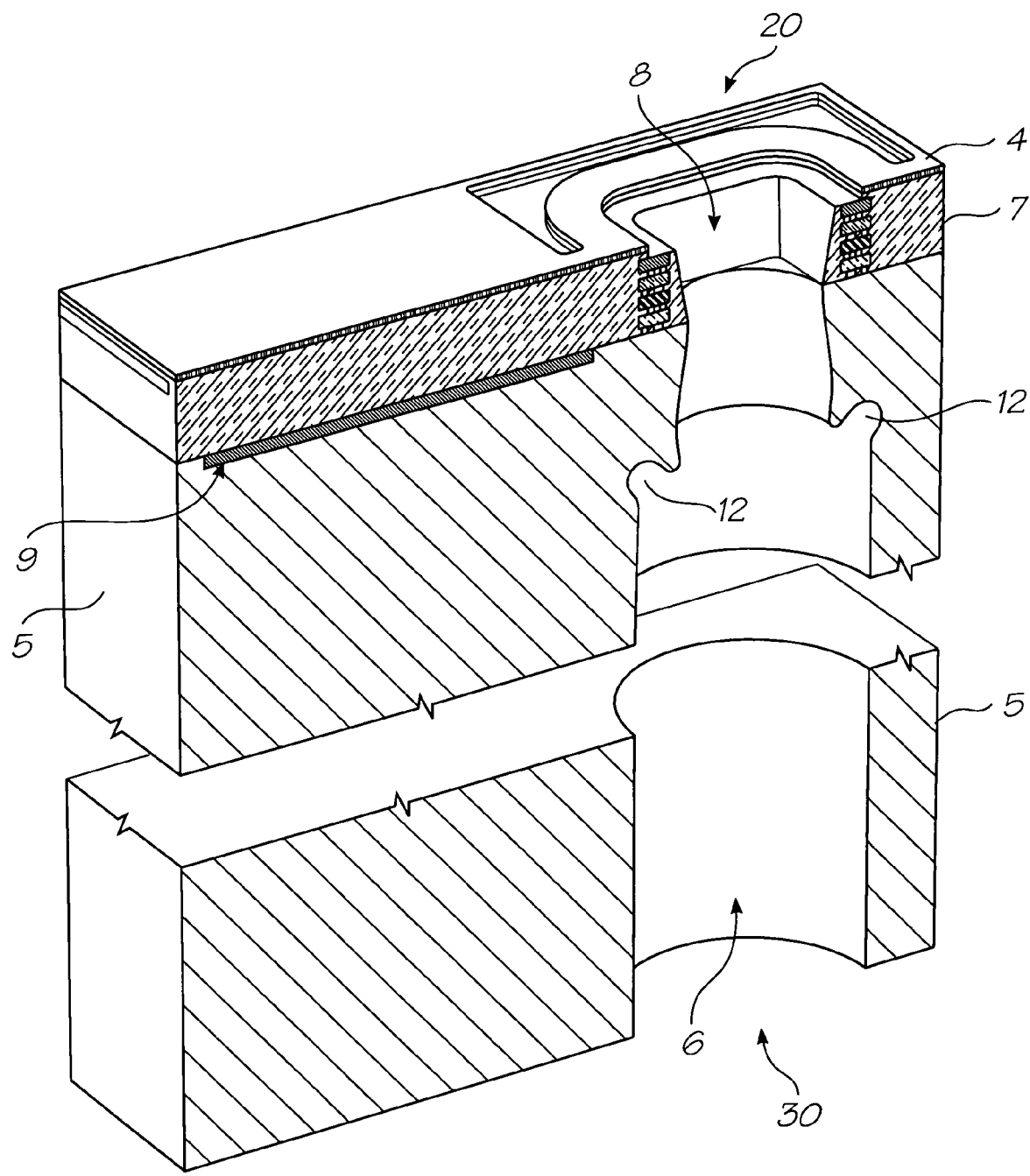
FIG. 8 is a cutaway perspective view of the partially fabricated printhead nozzle arrangement shown in FIG. 6, after stripping away the photoresist.

Finally, and referring to FIG. 8, the wafer shown in FIG. 7 is ashed, which completely strips away the photoresist plug 10 and provides fluid connection between the inlet 8 and the ink supply channel 6.

EXAMPLE

Figure 9:
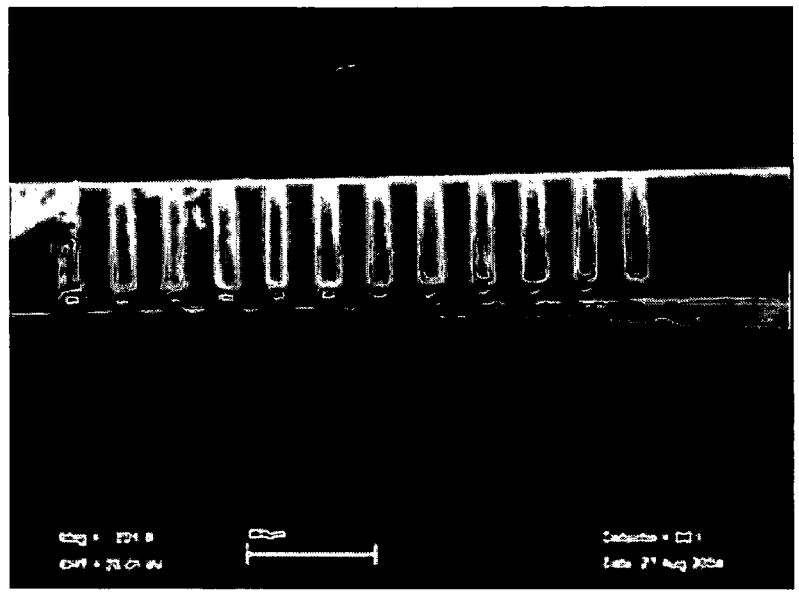
FIG. 9 is an SEM micrograph of a silicon wafer having 12 trenches back-etched to within 5 □m of corresponding front plugs.

A silicon wafer having a thickness of 200 □m was prepared as follows. Using a standard anisotropic DRIE process a trench, having a diameter of 14 □m and a depth of 28 □m, was etched into a frontside of the wafer. The trench was filled with photoresist to form a front plug. With the frontside of the wafer attached to a glass handle wafer, the backside is then etched to within 5 □m of the back surface of the front plug. Again, a standard anisotropic DRIE process is used for backside etching. The back-etched main trench had a depth of about 170 μm and a diameter of about 21 μm. FIG. 9 is an SEM micrograph of the silicon wafer after back-etching to within 5 μm of the front plug.

Figure 10:
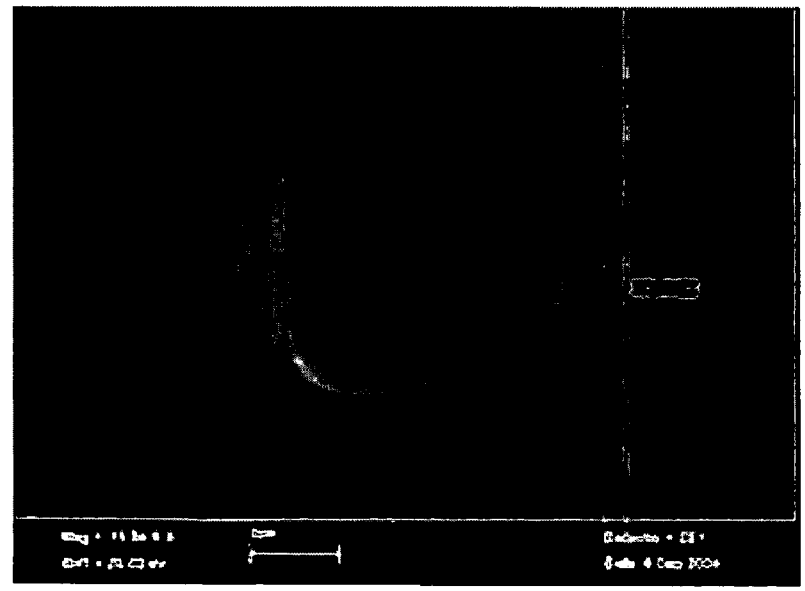
FIG. 10 is a magnified SEM micrograph of a silicon wafer showing a trench back-etched 5 □m beyond a front plug.

Back-etching was continued to the back surface of the front plug and about 5 μm past the front plug, under anisotropic etching conditions. FIG. 10 is an SEM micrograph of part of the trench after back-etching past the front plug. As shown in FIG. 10, a spiked circumferential rim extends around the front plug, where the back-etch did not etch completely flush against the front plug.

The silicon wafer, as prepared above, was then etched in accordance with the method of the present invention.

A standard inductively coupled plasma DRIE reactor ("HRM Pro" tool, supplied by Surface Technology Systems) was configured as follows:

| | |
|---|---|
| ICP top power: | 2500 W |
| Bias power: | 50 W |
| Plasma gas: | $O_2$ |
| Chamber temperature: | 120° C. |
| Cooling: | Backside helium cooling, 9.5 Torr, 10° C. |
| Chamber pressure: | 80 m Torr |
| $O_2$ flow rate: | 80 sccm |

Figure 11:
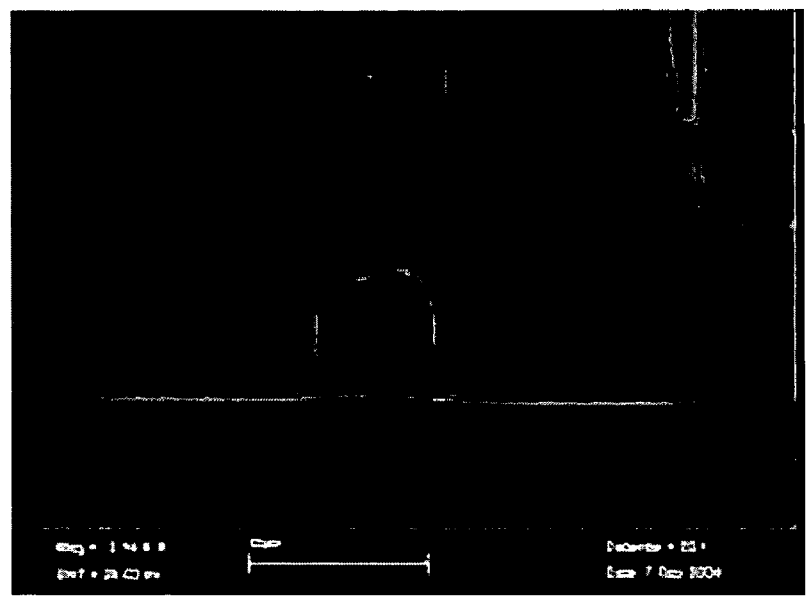
FIG. 11 is an SEM micrograph of a trench after biased oxygen plasma etching according to the invention.
Figure 12:
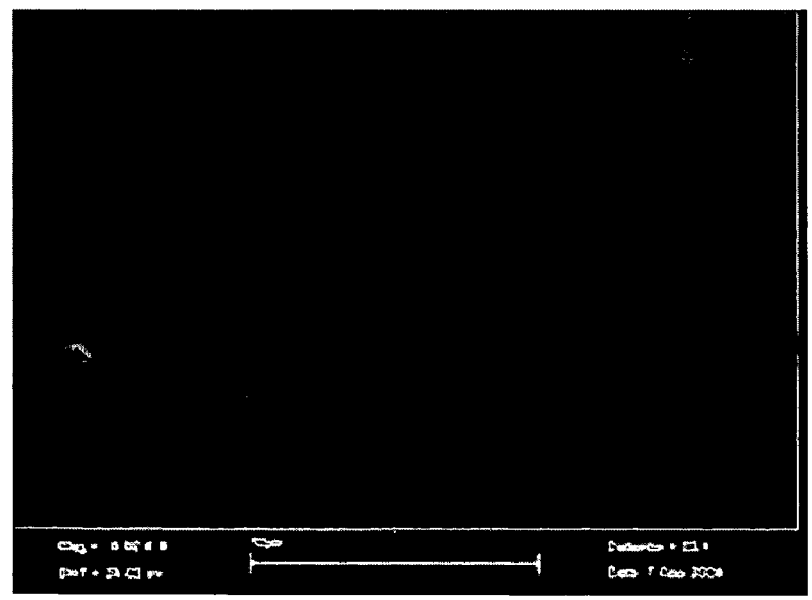
FIG. 12 is a magnified view of FIG. 11.

The wafer was back-etched under these conditions for 60 minutes. The etch removed a portion having a depth of 7 μm from the back side of the front plug. During etching, a polymer layer deposited on the sidewalls of the main trench was also removed. FIGS. 11 and 12 are SEM micrographs of part of the silicon wafer, showing in detail the 7 μm portion of front plug removed by the oxygen plasma etch. FIG. 12 also shows a spiked circumferential projection (formerly a rim around the front plug), having a thickness of 1.7 μm, extending towards the back side of the wafer.

Following the oxygen plasma etch, the plasma reactor was reconfigured as follows:

| | |
|---|---|
| ICP top power: | 2500 W |
| Bias power: | 300 W |
| Plasma gas: | Ar |
| Chamber temperature: | 120° C. |
| Cooling: | Backside helium cooling, 9.5 Torr, 10° C. |
| Chamber pressure: | 10 m Torr |
| $O_2$ flow rate: | 100 sccm |

Figure 13:
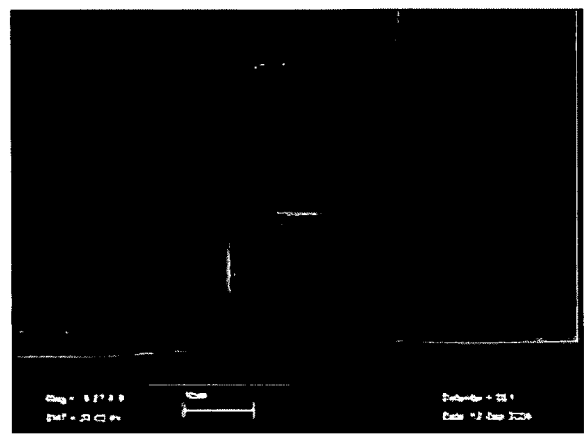
FIG. 13 is an SEM micrograph of a trench after argon ion milling.

The wafer was back-etched ("ion milled") under these conditions for 15-20 minutes. FIG. 13 is an SEM micrograph of the resultant trench, which shows the spiked circumferential projection rounded down to a smooth surface. The absence of spiked projections at the junctions of the front-etched and back-etched trenches significantly improves the surface profile of the resultant channel, once the photoresist has been stripped away.

It will, of course, be appreciated that the present invention has been described purely by way of example and that modifications of detail may be made within the scope of the invention, which is defined by the accompanying claims.

The invention claimed is:

1. A process for facilitating modification of an etched trench, the process comprising:
   (a) providing a wafer comprising at least one etched trench, the at least one trench having a photoresist plug at its base; and
   (b) removing a portion of said photoresist at said base of said trench by subjecting the wafer to a biased oxygen plasma etch, thereby facilitating modification of said trench, wherein said trench has a depth in the range of 100 to 300 μm, and wherein said process forms part of a printhead fabrication process.

2. The process of claim 1, wherein the wafer comprises a plurality of etched trenches.

3. The process of claim 1, wherein the biased oxygen plasma etch removes a depth of 1 to 15 μm from an exposed surface of the photoresist plug.

4. The process of claim 1, wherein removal of a portion of the photoresist exposes sidewall features of the trench.

5. The process of claim 4, further comprising the step of:
   (c) ion milling the exposed sidewall features.

6. The process of claim 1, wherein trench sidewalls are concomitantly hydrophilized by the biased oxygen plasma etch.

7. The process claim 6, wherein concomitant hydrophilization includes removal of a polymeric layer from the trench sidewalls.

8. The process of claim 1, wherein the biased oxygen plasma etch is performed in a plasma etching reactor.

9. The process of claim 8, wherein the plasma etching reactor has a bias power in the range of 10 to 100 W.

10. The process of claim 8, wherein the plasma etching reactor has a chamber pressure in the range of 20 to 140 mTorr.

11. The process of claim 1, wherein the etched trench is an ink supply channel for a printhead.

12. A method of fabricating an inkjet printhead integrated circuit comprising a plurality of nozzles, ejection actuators, associated drive circuitry and ink supply channels, the method comprising the steps of:
   (i) providing a wafer having a front drop ejection side and a back ink supply side;
   ii) etching a plurality of trenches partially into the drop ejection side of the wafer;
   (iii) filling each of the trenches with a photoresist plug;
   iv) forming a plurality of corresponding nozzles, ejection actuators and associated drive circuitry on the drop ejection side of the wafer using lithographically masked etching techniques;
   (v) back-etching a plurality of corresponding ink supply channels from the ink supply side of the wafer to and past the photoresist plugs;
   (vi) removing a portion of each photoresist plug in each trench by subjecting the wafer to a biased oxygen plasma etch, thereby exposing sidewall features in the ink supply channels;
   (vii) modifying the exposed sidewall features; and
   (viii) stripping the photoresist plugs from the trenches to form nozzle inlets, thereby providing fluid connection between the ink supply side and the nozzles.

13. The method of claim 12, wherein the exposed sidewall features include a circumferential rim around at least a part of the photoresist plug, the circumferential rim being exposed by removing a portion of each plug.

14. The method of claim 12, wherein the exposed sidewall features are modified by argon ion milling.

15. The method of claim 14, wherein the argon ion milling smoothes and/or rounds the exposed sidewall features.

16. The method of claim 14, wherein the argon ion milling is performed in a plasma etching reactor.

17. The method of claim 12, wherein ink supply channel sidewalls are concomitantly hydrophilized by the biased oxygen plasma etch.

* * * * *